United States Patent
Giguere et al.

(10) Patent No.: US 9,619,611 B2
(45) Date of Patent: Apr. 11, 2017

(54) MODELING TOOL, METHOD AND COMPUTER PROGRAM PRODUCT FOR DYNAMICALLY GENERATING A MAINTENANCE SIMULATION OF A VEHICLE

(71) Applicant: CAE Inc., Saint-Laurent (CA)

(72) Inventors: Ghislain Giguere, Terrasse-Vaudreuil (CA); Thai Hoa Vo, Laval (CA); Mikhail Nejelski, Montreal (CA); Claude Cayer, La Prairie (CA); Eric Harvey, St-Eustache (CA)

(73) Assignee: CAE INC, Saint-Laurent (CA)

( * ) Notice: Subject to any disclaimer, the term of this patent is extended or adjusted under 35 U.S.C. 154(b) by 0 days.

(21) Appl. No.: 14/496,995

(22) Filed: Sep. 25, 2014

(65) Prior Publication Data
US 2016/0092628 A1  Mar. 31, 2016

(51) Int. Cl.
 G06G 7/48 (2006.01)
 G06F 17/50 (2006.01)

(52) U.S. Cl.
 CPC ...... *G06F 17/5095* (2013.01); *G06F 17/5009* (2013.01)

(58) Field of Classification Search
 CPC .... G06F 17/5095; G06F 17/5009; G09B 9/00
 USPC .......................... 703/8; 434/30, 62, 219, 305
 See application file for complete search history.

(56) References Cited

U.S. PATENT DOCUMENTS

| | | | |
|---|---|---|---|
| 6,766,311 B1 * | 7/2004 | Wall et al. | 706/46 |
| 2004/0024570 A1 * | 2/2004 | Muehl et al. | 702/184 |
| 2005/0095572 A1 | 5/2005 | Cormer et al. | |
| 2006/0047378 A1 * | 3/2006 | Betters et al. | 701/3 |
| 2012/0156653 A1 | 6/2012 | Wokurka | |
| 2012/0308965 A1 * | 12/2012 | Andrews et al. | 434/30 |

FOREIGN PATENT DOCUMENTS

CA  2876727 A1  12/2013

* cited by examiner

*Primary Examiner* — Aniss Chad
(74) *Attorney, Agent, or Firm* — IP Delta Plus Inc

(57) ABSTRACT

The present modeling tool and method dynamically generate a maintenance simulation of a vehicle. For doing so, a configuration interface receives a list of components of the vehicle, each particular component comprising parameters defining the particular component. The configuration interface further receives relationships between the components in the list, and determines a plurality of state, transitions, conditions, triggers and actions. A processing unit processes the data received and determined via the configuration interface to generate the maintenance simulation, the maintenance simulation comprising an aggregation of all the determined transitions between the components into a global state machine. The present method may further be performed by a computer program product.

15 Claims, 16 Drawing Sheets

MODELING TOOL, METHOD AND COMPUTER PROGRAM PRODUCT FOR DYNAMICALLY GENERATING A MAINTENANCE SIMULATION OF A VEHICLE

TECHNICAL FIELD

The present disclosure relates to the field of equipment maintenance simulation. More specifically, the present disclosure relates to a modeling tool and method for dynamically generating a maintenance simulation of a vehicle.

BACKGROUND

A simulation is the imitation of the operation of a physical world process or system over time. Simulating a process or a system usually first requires that a model be developed; this model representing the key characteristics of the selected physical or abstract system or process. Simulation is used in many contexts, such as simulation of technology for performance optimization, education, video games, safety engineering, testing, training, etc.

Due to the sometimes complicated, and relatively expensive nature of training on physical world equipment, simulation has become a commonly used alternative across many industries. The industry of interest, in the present disclosure, is the industry of maintenance of vehicles, for example the maintenance of an aircraft or a tank. Most of the times, the simulations performed on an equipment simulator include pre-built scenarios by which to teach trainees and to test their knowledge and abilities. Such equipment simulators are intended to create a safe and cost effective alternative to training on live equipment.

Furthermore, the simulations can be customized, by adding new scenarios or modifying existing scenarios. For example, in the maintenance of an aircraft, a trainer may want to add new parts to simulate a different scenario in the maintenance of the aircraft; or the trainer may want to update the version of a part that has been modified by the manufacturer. In both cases, the customization of the equipment simulator is generally performed through an update of a simulation software executed by the simulator. Consequently, whenever a modification or a customization of the equipment simulator is sought, at least a portion of the simulation software need to be recoded in order for the modifications or the customization to be implemented by the equipment simulator.

Therefore, modification and customization of the equipment simulator is generally complex, time consuming and resource intensive, because of the necessity to partially recode the simulation software. There is thus a need for a modeling tool and method for dynamically generating a maintenance simulation of a vehicle.

SUMMARY

According to a first aspect, the present disclosure provides a modeling tool for dynamically generating a maintenance simulation of a vehicle. The tool comprises a configuration interface, a memory, a display and a processing unit. The tool comprises a configuration interface, at least one memory, a display, and a processing unit. The configuration interface is adapted for receiving a list of components of the vehicle, each particular component comprising parameters defining the particular component. The configuration interface is also adapted for receiving relationships between the components in the list, the relationships between the components defining a hierarchy of the components in the list. The configuration interface further determines a plurality of states of a specific component of the hierarchy of components, determines transitions between the states of the specific component, determines conditions for executing the transitions, each condition comprising at least one other component being in a particular state, determines triggers of the transitions, and determines actions triggered by the transitions of the specific component, each action comprising at least one transition of another component. The at least one memory is adapted for storing the list of components and the relationships between the components, and storing the maintenance simulation. The display is adapted for displaying the hierarchy of components based on the relationships between the components. The processing unit stores the received list of components and relationships between the components in the memory. The processing unit further processes the data received and determined via the configuration interface to generate the maintenance simulation, the maintenance simulation comprising an aggregation of all the determined transitions between the components into a global state machine, and stores the generated maintenance simulation in the memory.

According to a second aspect, the present disclosure provides a method for dynamically generating a maintenance simulation of a vehicle. The method comprises receiving a list of components of the vehicle, each particular component comprising parameters defining the particular component and receiving relationships between the components in the list, the relationships between the components defining a hierarchy of the components in the list. The method further comprises displaying on a display the hierarchy of components based on the relationships between the components. The method pursues with determining a plurality of states of a specific component of the hierarchy of components, determining transitions between the states of the specific component, determining conditions for executing the transitions, each condition comprising at least one other component being in a particular state, determining triggers of the transitions and determining actions triggered by the transitions of the specific component, each action comprising at least one transition of another component. The method continues with processing by a processing unit the received data and the determined data to generate the maintenance simulation, the maintenance simulation comprising an aggregation of all the determined transitions between the components into a global state machine.

According to a third aspect, the present disclosure provides a computer program product deliverable via an electronically-readable media such as storage media and communication links, the computer program product comprising instructions which when executed by a processing unit provide for dynamically generating a maintenance simulation of a vehicle by implementing the aforementioned method.

BRIEF DESCRIPTION OF THE DRAWINGS

Embodiments of the disclosure will be described by way of example only with reference to the accompanying drawings, in which.

DETAILED DESCRIPTION

The foregoing and other features will become more apparent upon reading of the following non-restrictive description of illustrative embodiments thereof, given by way of example only with reference to the accompanying drawings. Like numerals represent like features on the various drawings.

Various aspects of the present disclosure generally address one or more of the problems related to the dynamic generation of a maintenance simulation of a vehicle.

For the purpose of clarity, some aspects related to components of a vehicle are introduced, before describing a modeling tool, a method and a computer program product for dynamically generating a maintenance simulation of a vehicle comprising the components. Therefore, following is a description of a hierarchy of components of a vehicle, along with parameters defining these components.

Figure 1:
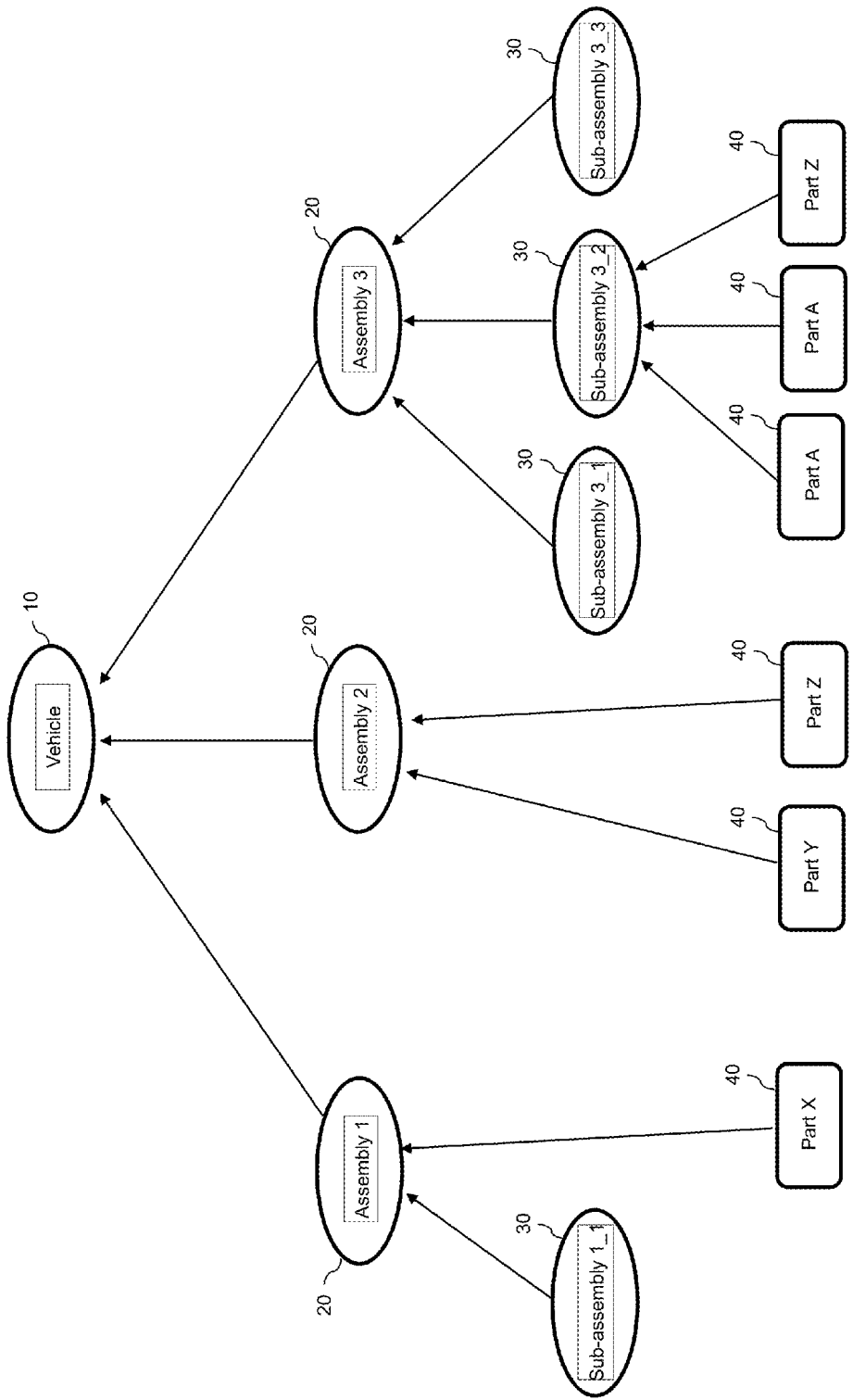
FIGS. 1 and 2 represent relationships between components of a vehicle.
Figure 2:
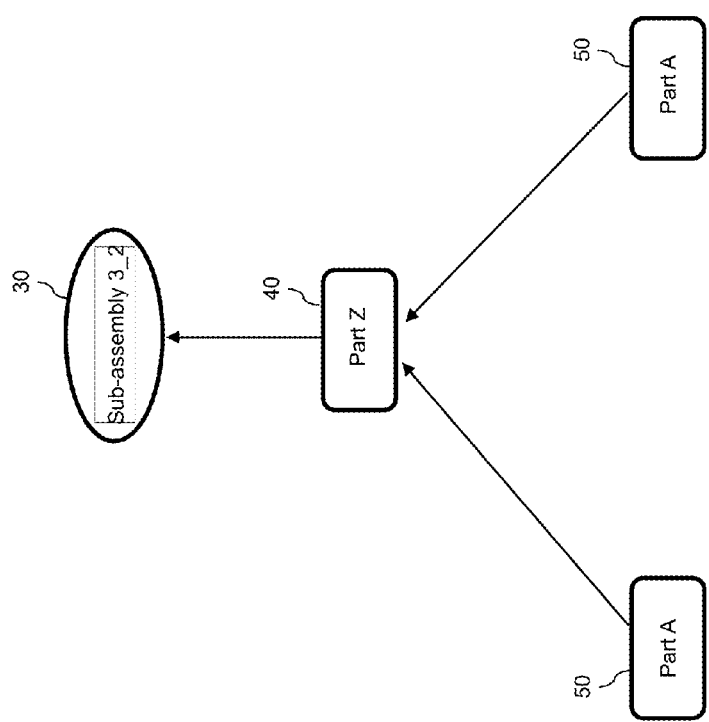

Reference is now made concurrently to FIGS. 1 and 2, which represent relationships between components of a vehicle, the relationships defining an exemplary hierarchy of the components of the vehicle. The term 'vehicle' is used throughout the present specification to refer to any type of machine, either on the ground, air, water and/or space, for transporting goods and individuals, by converting power into motion.

The exemplary hierarchy comprises three levels of components: parts 40, sub-assemblies 30 and assemblies 20. Parts 40 form the lowest level of the hierarchy, sub-assemblies 30 form an intermediate level of the hierarchy, and assemblies 20 form the highest level of the hierarchy. The aggregation of all the assemblies 20 forms the vehicle 10. A relationship between a specific component (e.g. a sub-assembly 30) and a specific sub-component (e.g. a part 40) of the hierarchy can be described as the specific component being a parent of the specific sub-component and/or the specific sub-component being a child of the specific component.

An assembly 20 is a component of the vehicle 10 that implements a high level functionality of the vehicle 10. An assembly 20 can have parent relationships with one of the following: at least one sub-assembly 30, at least one part 40, or a combination thereof. A parent assembly 20 is of a larger functional scope compared to a child sub-assembly 30 or a child part 40. Alternatively, an assembly 20 may have no parent relationship with any sub-assemblies 30 or parts 40, for example in a case where it is not useful in the context of the maintenance simulation to detail the child components (sub-assemblies 30 and/or parts 40) of such an assembly 20. For illustration purposes, when the vehicle 10 is an aircraft, the following may represent, without limitations, assemblies 20 of the aircraft: wings, a fuselage, stabilizers, a landing gear, electrical circuits, hydraulic circuits, etc.

A sub-assembly 30 is a component of the vehicle 10, which depends hierarchically from an assembly 20 of the vehicle 10. The sub-assembly 30 implements a sub-functionality of a wider functionality implemented by the parent assembly 20. A sub-assembly 30 can have parent relationships with at least one part 40 and has a child relationship with an assembly 20. A sub-assembly 30 is of a larger functional scope compared to a child part 40, but is of a narrower functional scope compared to a parent assembly 20. Alternatively, a sub-assembly 30 may have no parent relationship with any parts 40, for example in a case where it is not useful in the context of the maintenance simulation to detail the child components (parts 40) of such a sub-assembly 30. For illustration purposes, when the vehicle 10 is an aircraft and the assembly 20 is a landing gear, the following may represent, without limitations, sub-assemblies 30 of the landing gear: breaks, a retraction actuator, a rotation actuator, tires, wheels, etc. In an alternative illustration, when the assembly 20 is a hydraulic system of an aircraft, the following may represent, without limitations, sub-assemblies 30 of the hydraulic system: a reservoir, an accumulator, a filter, a power pump, a system relief valve, a pressure regulator etc.

A part 40 is a component of the vehicle 10, which depends hierarchically from an assembly 20 or a sub-assembly 30 of the vehicle. The part 40 may implement a sub-functionality of a wider functionality implemented by the parent assembly 20 or sub-assembly 30. The part 40 may also implement a physical relationship with respect to its parent (e.g. the part 40 secures the parent sub-assembly 30 to the parent assembly 20). A part 40 has a child relationship with one of a sub-assembly 30 or an assembly 20. For illustration purposes, when the vehicle 10 is an aircraft, the assembly 20 is a landing gear and the sub-assembly 30 is a wheel, the following may represent, without limitations, parts 40 of the wheel: bearings, o-rings, bolts, washers, etc. The parts 40 may also consist of screws for fixing a metallic panel (the parent sub-assembly of the screws) to the fuselage (the parent assembly of the metallic panel). In an alternative illustration, when the assembly 20 is a hydraulic system of an aircraft and the sub-assembly 30 is a pressure regulator, the following may represent, without limitations, parts 40 of the pressure regulator: a piston, a check valve, a spring, etc. In still another alternative illustration, when the sub-assembly 30 is an accumulator of the hydraulic system, the following may represent, without limitations, parts 40 of the accumulator: a screw plug, a seal ring, a diaphragm a shut off-button, a steel shell, etc.

In another exemplary embodiment, the vehicle 10 may be a tank, and the assemblies 20 may include, without limitations, at least one of the following: a turret, a cannon, tracks, etc. When the vehicle 10 is a tank and the assembly 20 a turret, then sub-assemblies 30 may include, without limitations, at least one of the following: a turret seat, a turret hatch race, a leader's hatch, a periscope, etc. In another example, considering the cannon of the tank as an assembly 20, sub-assemblies 30 may include, without limitations, at least one of the following: a gun mantlet, a coaxial gun, a fume extractor, a main gun, etc. In still another example, considering the cannon of the tank as an assembly 20 and the main gun as a sub-assembly 30, then parts of the main gun may include, without limitations, at least one of the following: a king nut, a thrust nut, a gun tube, a piston, a bearing, etc.

Referring particularly to FIG. 1, an exemplary hierarchy of components is illustrated for the vehicle 10, comprising assemblies 20, sub-assemblies 30 and parts 40. The vehicle 10 comprises three assemblies 20 represented by Assembly 1, Assembly 2 and Assembly 3. The Assembly 1 has a parent relationship with one sub-assembly 30 represented by Sub-assembly 1_1 and one part represented by Part X. The Assembly 2 has a parent relationship with two parts 40, represented by Part Y and Part Z. The Assembly 3 has a parent relationship with three sub-assemblies 30, represented by Sub-assembly 3_1, Sub-assembly 3_2 and Sub-assembly 3_3. Sub-assembly 1_1, Sub-assembly 3_1 and Sub-assembly 3_3 have no parent relationship with any part 40. Sub-assembly 3_2 has a parent relationship with three parts 40, represented by two instances of Part A and Part Z. This exemplary hierarchy is for illustration purposes only. A hierarchy representing a vehicle 10 is usually far more complex and involves far more components.

Several instances of the same component may be present in the vehicle 10. For example, Part Z is present in Assembly 2 and in Sub-assembly 3_2. In this case, each instance of Part Z is uniquely identified by reference to its parent component (respectively Assembly 2 and Sub-assembly 3_2). Similarly, two instances of Part A are present in Sub-assembly 3_2. In this case, each instance of Part A cannot be uniquely identified by reference to its parent component, which is the same (Sub-assembly 3_2) for both instances of Part A. In order to differentiate each instance of Part A, the relationship between a specific instance of Part A and the Sub-assembly 3_2 also comprises a position of the specific instance of Part A. The position may be defined as follows: position with respect to the Sub-assembly 3_2, position with respect to other child parts of the Sub-assembly 3_2 (e.g. Part Z), or a combination of both. For example, if Sub-assembly 3_2 is a control panel and the two Parts A are screws for fixing the control panel to a flight deck (Assembly 3), the position of the two screws can be defined in a metric coordinates system with respect to the control panel. Alternatively, if Part Z is a screen on the control panel, the position of the two screws can be defined with respect to the screen (e.g. centered above and below the screen).

More generally, whenever a component of the hierarchy has a parent relationship with several instances of a same sub-component, a position of each specific instance of the sub-component is provided in order to uniquely identify the different instances. As mentioned previously, the position may be defined with respect to the parent component, with respect to other child component(s) of the parent component, or a combination of both. However, as will be detailed later in the description, a position may also be provided for a plurality of components of the hierarchy, for other purposes than solely identification purposes.

Although represented in FIG. 1 with three levels for illustration purposes, the hierarchy may comprise more or less levels. For example, a hierarchy can comprise two levels from one of the following combinations of levels: assemblies and parts, or assemblies and sub-assemblies. In another example, a hierarchy can comprise four levels, as follows: assemblies, sub-assemblies, parts, and sub-parts. FIG. 2 illustrates the latter example of a four level hierarchy. A sub-assembly 30 (Sub-assembly 3_2) has a parent relationship with a part 40 (Part Z), which has a parent relationship with two sub-parts 50 (two instances of Part A).

The levels of the hierarchy may be labeled with a different terminology than assemblies, sub-assemblies, parts (and sub-parts). For example, in a three level hierarchy, the levels may be labeled as follows: level 1, level 2 and level 3. Additionally, the levels of the hierarchy may be represented by at least one of the following: colors and shapes. For example, in a three level hierarchy, the levels may be represented as follows: red, blue and orange; or circle, square and triangle; or red circle, blue square and orange triangle.

Figure 3:
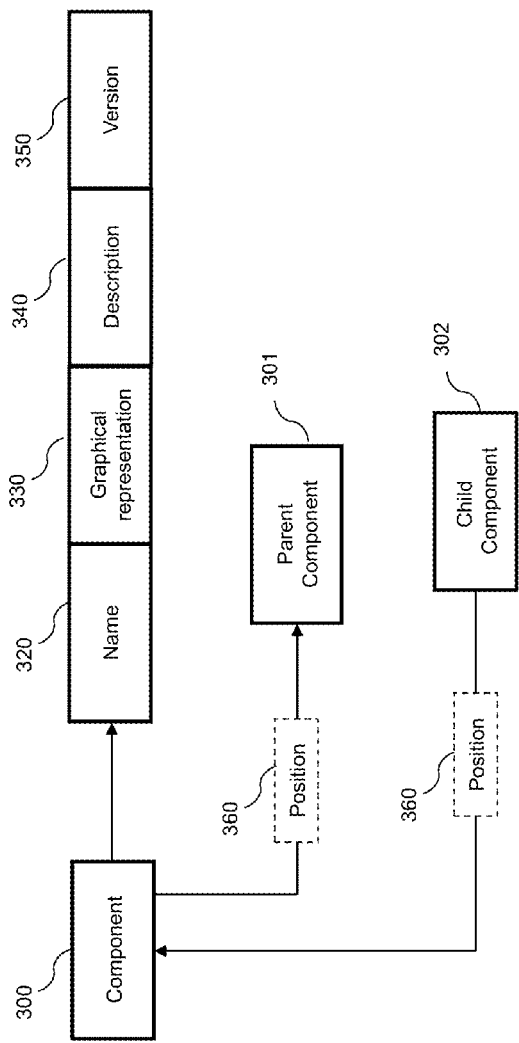
FIG. 3 represents parameters of one of the components illustrated in FIG. 1 or 2.

Referring now concurrently to FIGS. 1 and 3, a component 300 is further defined by parameters of the component. The component 300 may be one of an assembly 20, a sub-assembly 30 or a part 40, as illustrated in FIG. 1. The parameters of the component 300 comprise a name 320 of the component, a graphical representation 330 of the component, a description 340 of the component, and a version 350 of the component. These parameters are for illustrations purposes only. Some of the parameters (e.g. the graphical representation 330 and/or the description 340 may not be present). Alternatively, additional parameters may be used to define the component 300.

Additionally, the parameters comprise an optional parameter: the position 360 of the component. As illustrated previously, the position 360 is used to identify the component 300 with respect to other instances of the same type of component. If there is no ambiguity for identifying the component 300, the position 360 may be absent; or it may be present, but used for other purposes than identification purposes. FIG. 3 illustrates an exemplary case where component 300 has a child relationship with a parent component 301, and its position is provided with respect to its parent component 301. Additionally, component 302 has a child relationship with component 300, and its position is provided with respect to its parent component 300.

The name 320 of a component 300 may be the generally accepted term for those skilled in the art. Alternatively, the name 320 of a component 300 is a specific term adopted in the particular context of the simulation.

The graphical representation 320 of a component 320 may be, without limitation, at least one of the following: a pictogram representing the component, a two dimensional or three dimensional illustration of the component, a two dimensional or three dimensional rendering of the component, etc. Furthermore, the components used in the simulation may have different graphical representations 320.

The description 340 of a component 300 consists in a text, which is for example provided by a supplier of the component. Alternatively, the description 340 consists of a link to a web page of a web site of the supplier of the component.

The version 350 is present in case the component 300 is available in more than one version. The version 350 generally consists of alphanumeric characters, such as for example 1_1, 1_2, 2_0, etc. The value of some of the parameters may therefore be depending on the version 350 of the component, for example the description 340 and/or the graphical representation 330. However, the same name 320 is used for all versions of a component 300, and the different versions are differentiated based on the value of the parameter version 350.

Referring now concurrently to FIGS. 1, 3, 4, 5A, 5B, 6 and 7, a modeling tool 100 and a method 200 for dynamically generating a maintenance simulation of a vehicle are presented.

Figure 6:
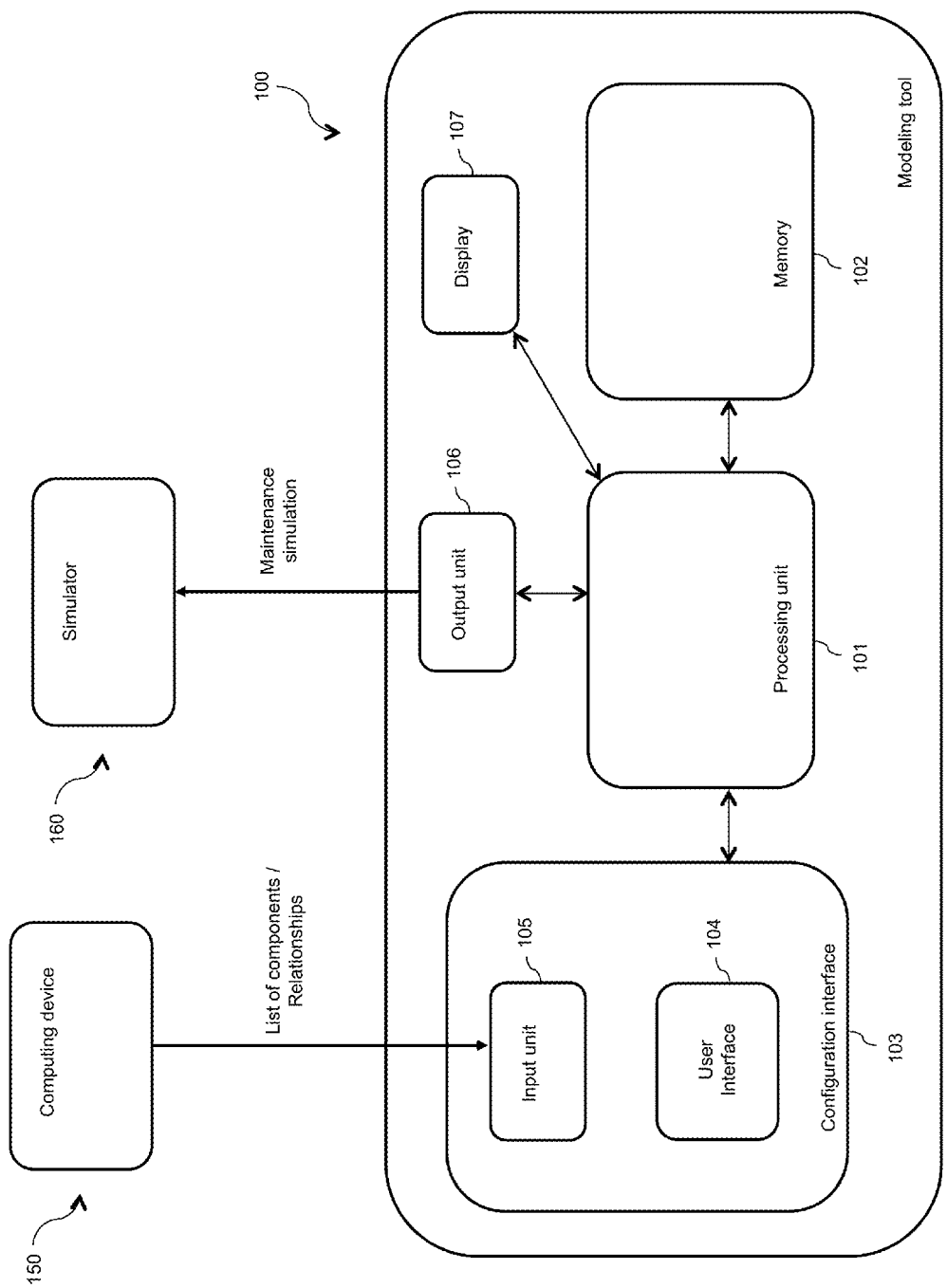
FIG. 6 represents a modeling tool for dynamically generating a maintenance simulation of a vehicle.

The modeling tool 100 comprises a processing unit 101, having one or more processors (not represented in FIG. 6) capable of executing instructions of a computer program. Each processor may further have one or several cores. The modeling tool 100 also comprises memory 102 for storing instructions of the computer program, data generated by the execution of the computer program, etc. Only a single memory 102 is represented in FIG. 6, but the modeling tool 100 may comprise several types of memories, including volatile memory (such as a volatile Random Access Memory (RAM)) and non-volatile memory (such as a hard drive).

The modeling tool 100 also comprise a configuration interface 103. The configuration interface 103 may comprise an input unit 105 and/or a user interface 104. The modeling tool 100 can receive configuration data from a computing device 150 via the input unit 105 (through communication links not represented in FIG. 6 for simplification purposes). The modeling tool 100 can also receive configuration data from a user via the user interface 104 (e.g. a keyboard, a mouse, a touchscreen, etc.). The modeling tool 100 may also comprise an output unit 106 for transmitting data (e.g. a generated maintenance simulation of a vehicle) to a simulator 160 (through communication links not represented in FIG. 6 for simplification purposes). Although not represented in FIG. 6, the computing device 150 and the simulator 160 comprise a processing unit (for respectively generating and processing the data exchanged with the modeling tool 100), memory, input/output units (for exchanging the data with the modeling tool 100), and optionally a user interface.

The modeling tool 100 further comprises a display 107 for displaying information received via the configuration interface 103 and/or generated by the processing unit 101.

In the rest of the description, reference to instructions of a specific computer program is made. The instructions of the specific computer program implement the steps of the method 200. The instructions are comprised in a computer program product and provide for dynamically generating a maintenance simulation of a vehicle, when executed by the processing unit 101. The computer program product is deliverable via an electronically-readable media such as a storage media or via communication links (e.g. an Intranet, a fixed or mobile communication network, etc.) through a communication interface (e.g. the input unit 105).

Figure 7:
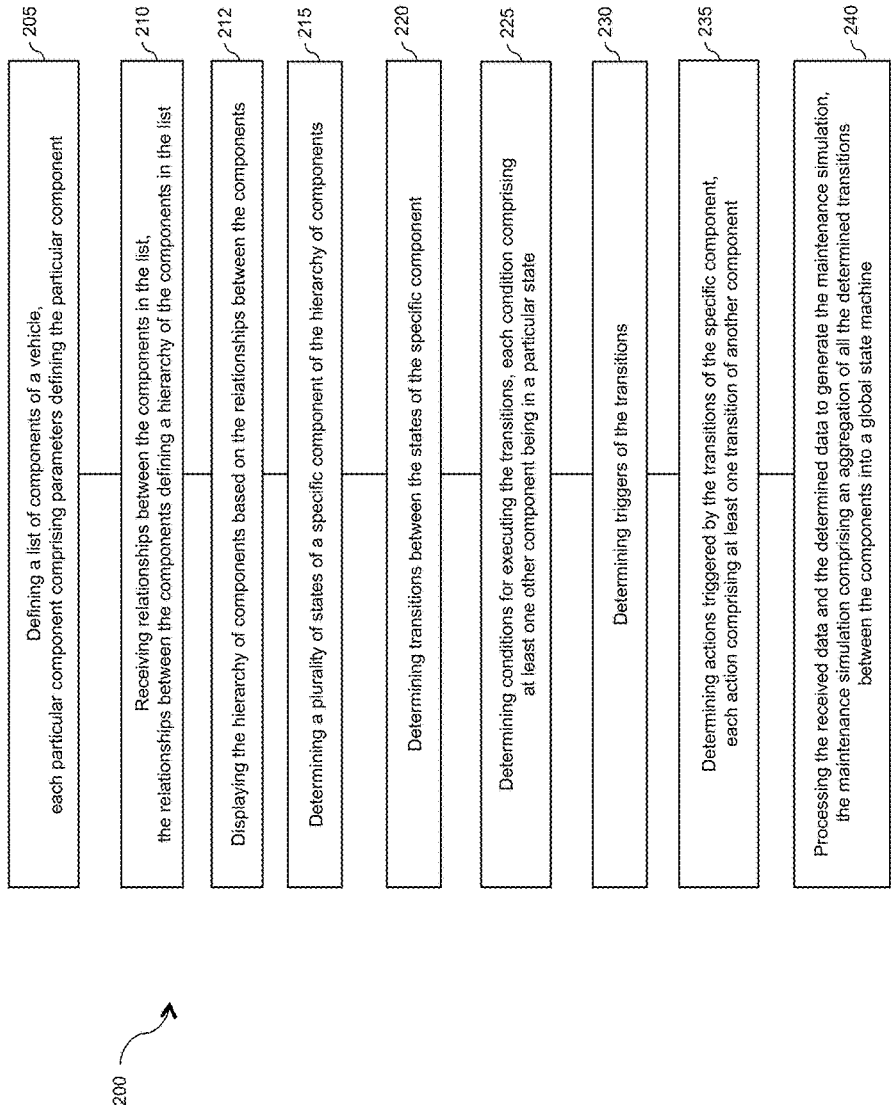
FIG. 7 represents a method for dynamically generating a maintenance simulation of a vehicle.

The method 200 represented in FIG. 7 comprises steps for dynamically generating a maintenance simulation of a vehicle.

The method 200 comprises the step 205 of defining via the configuration interface 103 a list of components of the vehicle. Each particular component in the list comprises parameters defining that particular component. The parameters have been described previously in relation to FIG. 3. In a particular aspect, the list of components is received via the input unit 105 of the configuration interface 103 from the computing device 150. The computing device 150 may be located at the premises of the manufacturer of the simulated vehicle and may consist of a Computer Aided Design (CAD) workstation.

The method 200 comprises the step 210 of receiving via the configuration interface 103 relationships between the components in the list. The relationships between the components defines a hierarchy of the components in the list. The relationships between the components and the hierarchy of components have been described previously in relation to FIGS. 1 and 2. Alternately, the step 210 of receiving via the configuration interface 103 relationships between the components in the list could be done automatically based on sets of rules, or manually entered by a user.

The received list of components and the relationships between the components are stored in the memory 102.

In a particular aspect, the list of components and the relationships between the components is received via the input unit 105 of the configuration interface 103 from the computing device 150. The computing device 150 may be located at the premises of the manufacturer of the simulated vehicle and may consist of a Computer Aided Design (CAD) workstation.

The method 200 comprises the step 212 of displaying on the display 107 the hierarchy of components based on the relationships between the components. For example, a user of the modeling tool can browse through the hierarchy of components via a Graphical User Interface (GUI) displaying the hierarchy of components on the display 107, in a manner facilitating the identification and selection (via the configuration interface 103) of a particular component within the hierarchy, for applying the following steps of the method 200 to the selected component. FIGS. 9-15 illustrate an example of such a GUI.

The method 200 comprises the step 215 of determining via the configuration interface 103 a plurality of states of a specific component of the hierarchy of components.

The method 200 comprises the step 220 of determining via the configuration interface 103 transitions between the states of the specific component.

The method 200 comprises the step 225 of determining via the configuration interface 103 conditions for executing the transitions. Each condition comprises at least one other component being in a particular state.

The method 200 comprises the step 230 of determining via the configuration interface 103 triggers of the transitions.

The method 200 comprises the step 235 of determining via the configuration interface 103 actions triggered by the transitions of the specific component. Each action comprises at least one transition of another component.

The determined states, transitions, conditions, triggers and actions are stored in the memory 102.

In a particular aspect, the selection of the specific component and the determination of the states, transitions, conditions, triggers, and actions are performed by a user via the user interface 104 of the configuration interface 103.

A state is a modifiable attribute of a component. A state is modifiable in the sense that the state of the component may change when a specific event occurs. A component generally has two or more states. As an example, referring to FIG. 4, the component 300 of the hierarchy of components is attributed two distinct states 410: State_1 and State_2. The component 300 may be in State_1, corresponding to the component 300 being installed in respect to another component; or the component 300 may be in State_2, corresponding to the component 300 being removed in respect to another component. Therefore, in the present example, the two states 410 of the components are as follows: installed and removed. Other examples of states may comprise the following: assembled and dismantled.

When a state of a component is modified, the initial state of the component is named a source state and the final sate of the component is named a target state. Therefore, if the component 300 of FIG. 4 begins in State_1 and ends in State_2, then State_1 is the source state and State_2 is the target state. For instance, if the component 300 begins in the state removed, and ends in the state installed, then the state removed is the source state, and the state installed is the target state.

Figure 4:
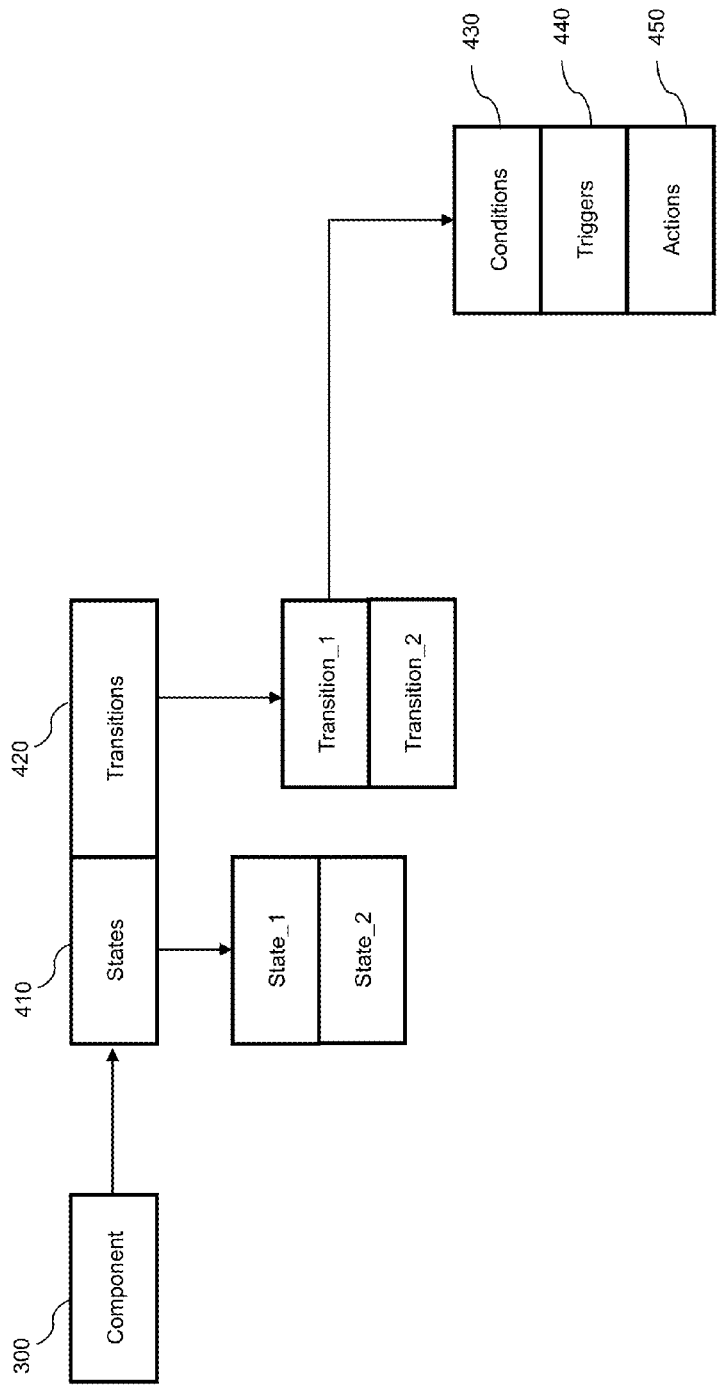
FIG. 4 represents states and transitions applicable to one of the components illustrated in FIG. 1 or 2.

The changeover of the state of a component from a source state to a target state is a transition. In FIG. 4, the component 300 may undergo two transitions 420: a transition from State_1 to State_2 (e.g. Transition_1), and from State_2 to State_1 (e.g. Transition_2).

In order for a component to undergo a transition from a source state to a target state, one condition or a group of conditions shall be met. For example, the component 300 of FIG. 4, may only undergo transition Transition_1 from State_1 to State_2 if the conditions 430 are met. Each condition comprises at least one other component from the hierarchy of components being in a particular state. For instance, a washer may only be removed if a nut holding the washer has been removed previously. Therefore, in that example, in order for the washer to undergo transition from the state installed to the state removed, a condition is that the nut shall be in the state removed.

A trigger 440 is an event provoking a transition (e.g. Transition_1) of a component 300 from a source state (e.g. State_1) to a target state (e.g. State_2) when all conditions 430 prerequisite to the transition are met. The trigger 440 is an event that occurs on a simulator 160 using the maintenance simulation generated by the present method 200 and modeling tool 100. For example, a transition of a component 300 displayed on a display of the simulator 160 may be triggered via a user interface of the simulator 160, for instance by a movement of a mouse on the display, a click on the mouse, (or a pressure, a pinch, a gesture of at least one finger on a touchscreen), etc.

An action 450 is performed on another component in complement to the transition (e.g. Transition_1) being performed on the current component 300. The action 450 is performed only if the condition(s) 430 for the transition (e.g. Transition_1) is met. An action comprises at least one transition of the other component. An action may consist of a pre-action or a post-action. A pre-action is performed before performing the transition (e.g. Transition_1) of the current component 300. A post-action is performed after performing the transition (e.g. Transition_1) of the current component 300.

For a given transition 420 (e.g. Transition_1), at least one condition 430 and at last one trigger 440 are defined. Any number of actions 450 (including none) can be defined.

Figure 5A:
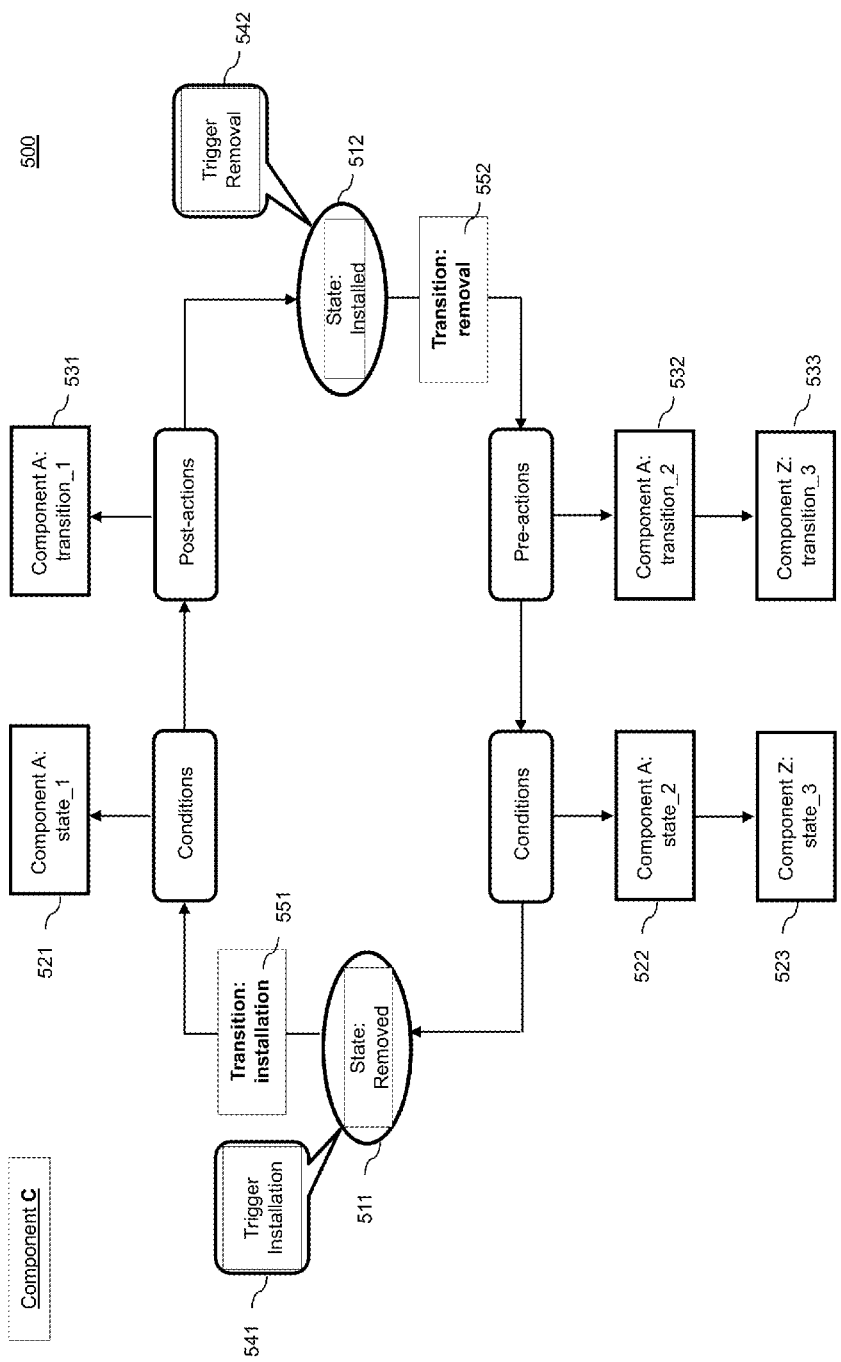
FIGS. 5A and 5B represent two exemplary state diagrams of one of the components illustrated in FIG. 1 or 2.

FIG. 5A represents an exemplary state diagram 500 of a component C. Starting with the component C in the state removed 511, an installation trigger 541 can cause the component C to undergo an installation transition 551 to the state installed 512. As represented in the state diagram 500, the condition 521 that another component A be in a particular state (state_1) must be respected prior to performing the transition 551 of component C. Also, when component C reaches the state installed 512 following the execution of the installation transition 551, a post action 531 is triggered causing component A to undergo a transition (transition_1). In the opposite direction, starting with component C in the state installed 512, a removal trigger 542 can cause the component C to undergo a removal transition 552 to the state removed 511. As represented in the state diagram 500, one condition 522 on the state of component A (must be in state_2) and one condition 523 on the state of component Z (must be in state_3) must be respected prior to performing the removal transition 552 of component C to the state removed 511. Furthermore, two pre-actions 532 and 533 are triggered causing component A and component Z to undergo transitions (transition_2 and transition_3 respectively), before executing the removal transition 552 (only if conditions 522 and 523 are met).

For illustration purposes, component C may be an assembly 20 representing an electric system of the vehicle 10. Components A and Z may be an accumulator and a pressure regulator, respectively two sub-assemblies 30 of an assembly 20 representing the hydraulic system of the vehicle 10. In order to trigger removal 552 of the electric system (component C), the accumulator (component A) and the pressure regulator (component Z) must first be removed (conditions 522-523 with state_2 and state_3 consisting of a removed state). Indeed, the electricity is needed in order for a maintenance technician to remove the sub-assemblies of the hydraulic system. Therefore, the removal of sub-assemblies of the hydraulic system shall be performed prior to the removal of the electric system.

Figure 5B:
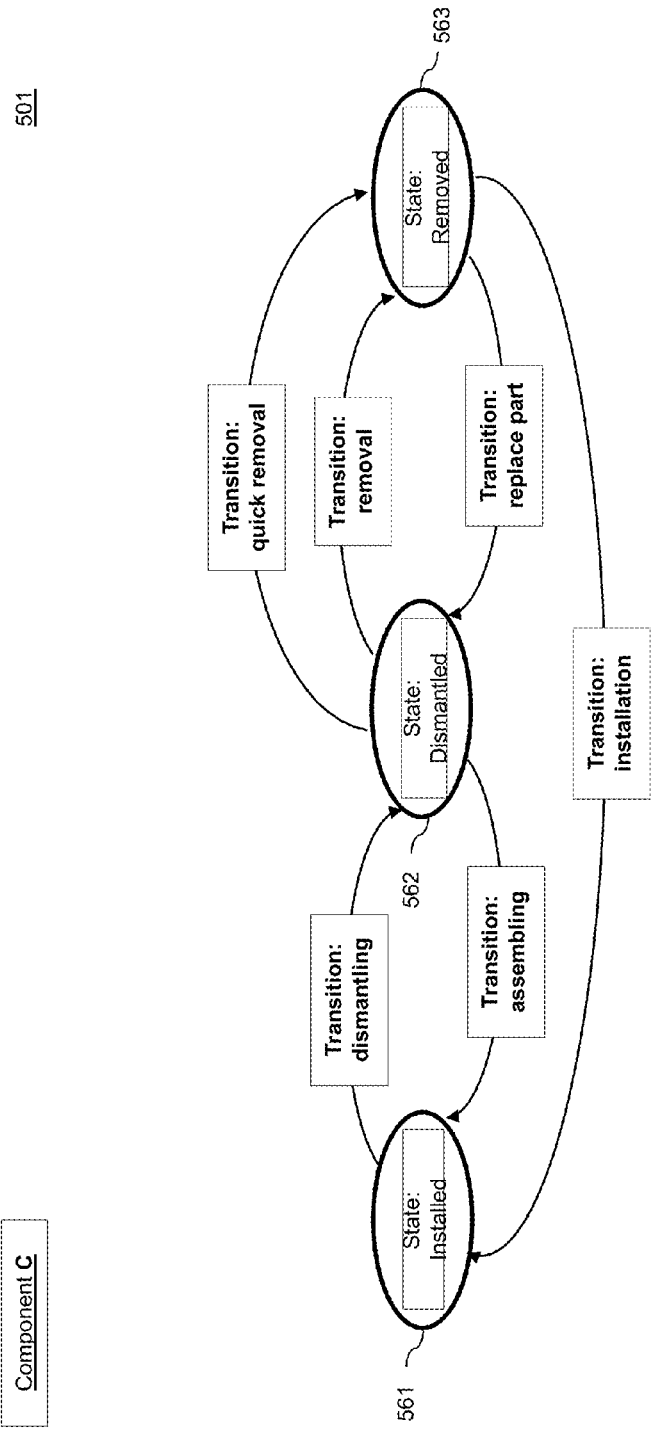

FIG. 5B represents another exemplary state diagram 501 with multiple transitions between states. This state diagram illustrates the possibility for a component to undergo transitions from one state to another through different paths of transitions. For example, starting with the component C in the state removed 563, the component C can undergo transition to the state installed 561 through two different paths. In one alternative, the component C can directly undergo transition from the state removed 563 to the state installed 561 through the transition installation. In another alternative, the component C can reach the state installed 561 from the state removed 563 through, successively, the transition replace part from the state removed 563 to the state dismantled 562, and the transition assembling from the state dismantled 562 to the state installed 561.

Similarly, starting with the component C in the state installed 561, the component C can reach the state removed 563 through different paths. In one alternative, the component C can reach to the state removed 563 from the state installed 561 through, successively, the transition dismantling and the transition removal. In another alternative, the component C can reach the state removed 563 from the state installed 561 through, successively, the transition dismantling and the transition quick removal. In both of the foregoing alternatives, the component C undergoes a first transition from the state installed 561 to the state dismantled 562; and then undergoes a second transition from the state dismantled 562 to the state removed 563.

The method 200 comprises the step 240 of processing by the processing unit 101 the data received and determined via the configuration interface 103, to generate the maintenance simulation. The maintenance simulation comprises an aggregation of all the determined transitions between the components into a global state machine. The generated maintenance simulation is stored in the memory 102.

The global state machine comprising all the possible transitions between the components can be represented in the form of a plurality of mathematical formula based on the positions 360, states 410, transitions 420, conditions 430, triggers 440 and actions 450 of the components 300.

For example, considering an assembly Assembly_1 having three child parts: two instances of Part_1 identified by their respective positions Position 1.1 and Position 1.2 and one instance of Part_2 (the position of the instance of Part_2 is not necessary to identify it uniquely). Assembly_1 has three states: State A1.1, State A1.2 and State A1.3; and can perform transitions between these states based on condition on the states of the parts.

For example, transition from State A1.1 to State A1.2 requires one of the two instances of Part 1 being in state State 1.2 and Part 2 being in state State 1.2. Transition from State A1.2 to State A1.3 requires Part 2 being in state State 1.3. Direct transition from State A1.1 to State A1.3 requires the two instances of Part 1 being in state State 1.2 and Part 2 being in state State 1.3.

The aforementioned transitions are for illustration purposes only. Although not included for simplification purposes, the triggers 440 and the actions 450 may also be taken into consideration in the transitions.

In a particular aspect, the method 200 comprises a step of automatically updating by the processing unit 101 the maintenance simulation with updated parameters (e.g. a graphical representation 330) corresponding to an updated version 350 of a component 300 illustrated in FIG. 3. The component 300 to be updated is identified by its name 320, its parent component 301 if it has one, and its position 360 relative to its parent component 301 if it has one. The version 350 of the component and some of its parameters (e.g. the graphical representation 330) are updated accordingly. Several instances of the same component can be updated simultaneously.

The identification of the component(s) to update, the updated parameters and the updated version are received via the configuration interface 103. For instance, they are received from the computing device 150 via the input unit 105. The update may be performed automatically when the computing device 150 is connected to a web server or a local server (not represented in FIG. 6). The web server or the local server triggers an update sending information to the computing device 150 determining the updates that are made in the parameters and version of the components. Alternatively, a user may manually update the parameters and version of the components through a user interface of the computing device 150. In both of the foregoing alternatives, the updated information is communicated from the computing device 150 to the modeling tool 100 via the input unit 105, either in a push mode (automatic transfer of the updated information when they are available on the computing device 150) or in a pull mode (transfer upon a request for updates from the modeling tool 100).

Figure 8:
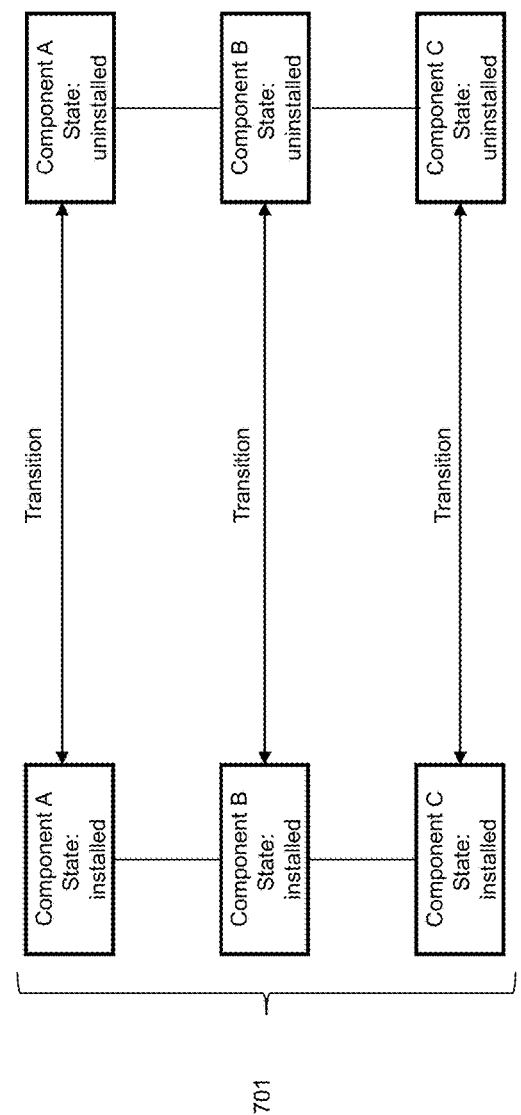
FIG. 8 represents an example of a group behavior.
Figure 9:
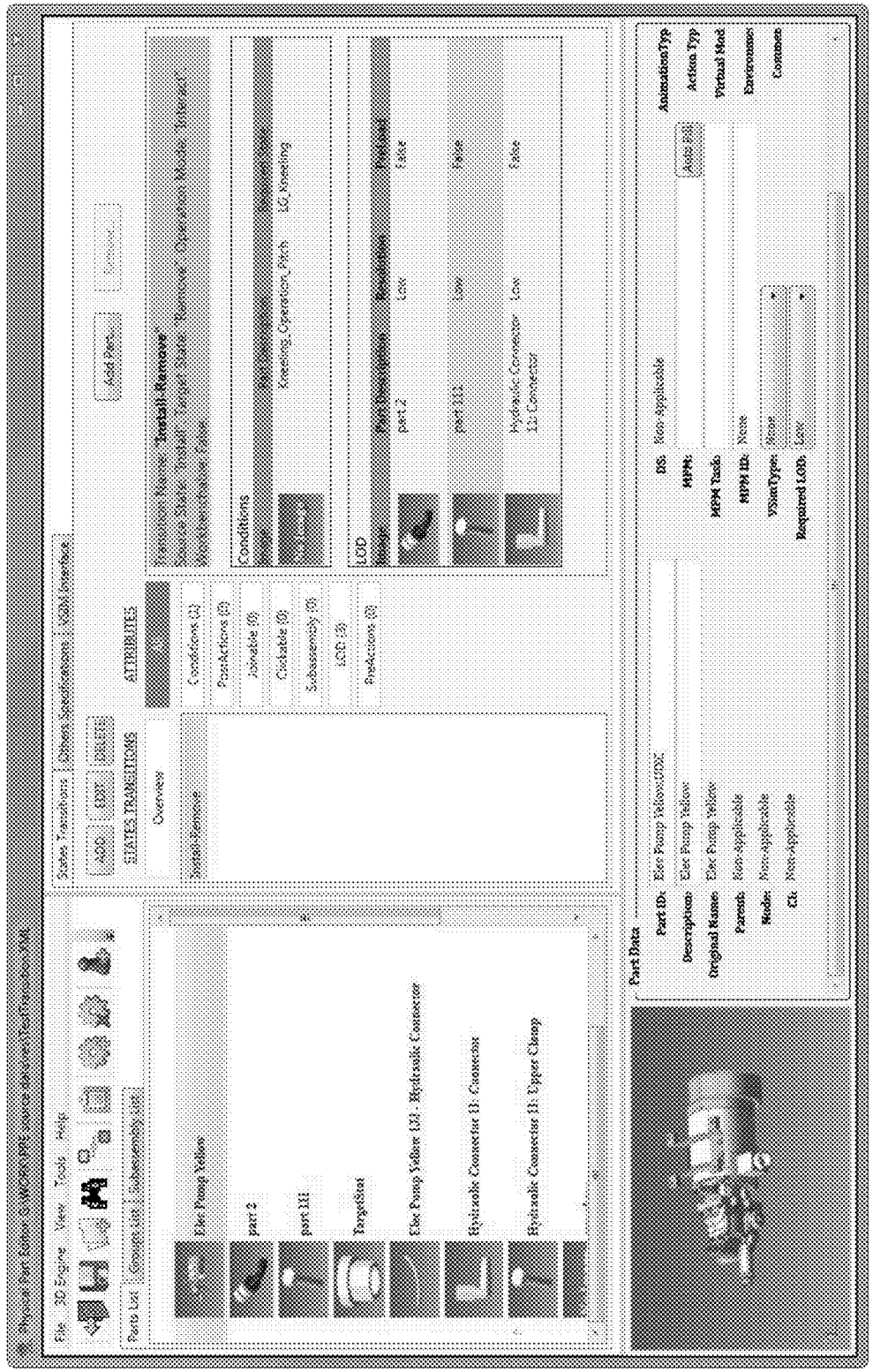
FIGS. 9-15 represent an exemplary Graphical User Interface of the modeling tool of FIG. 6.
Figure 10:
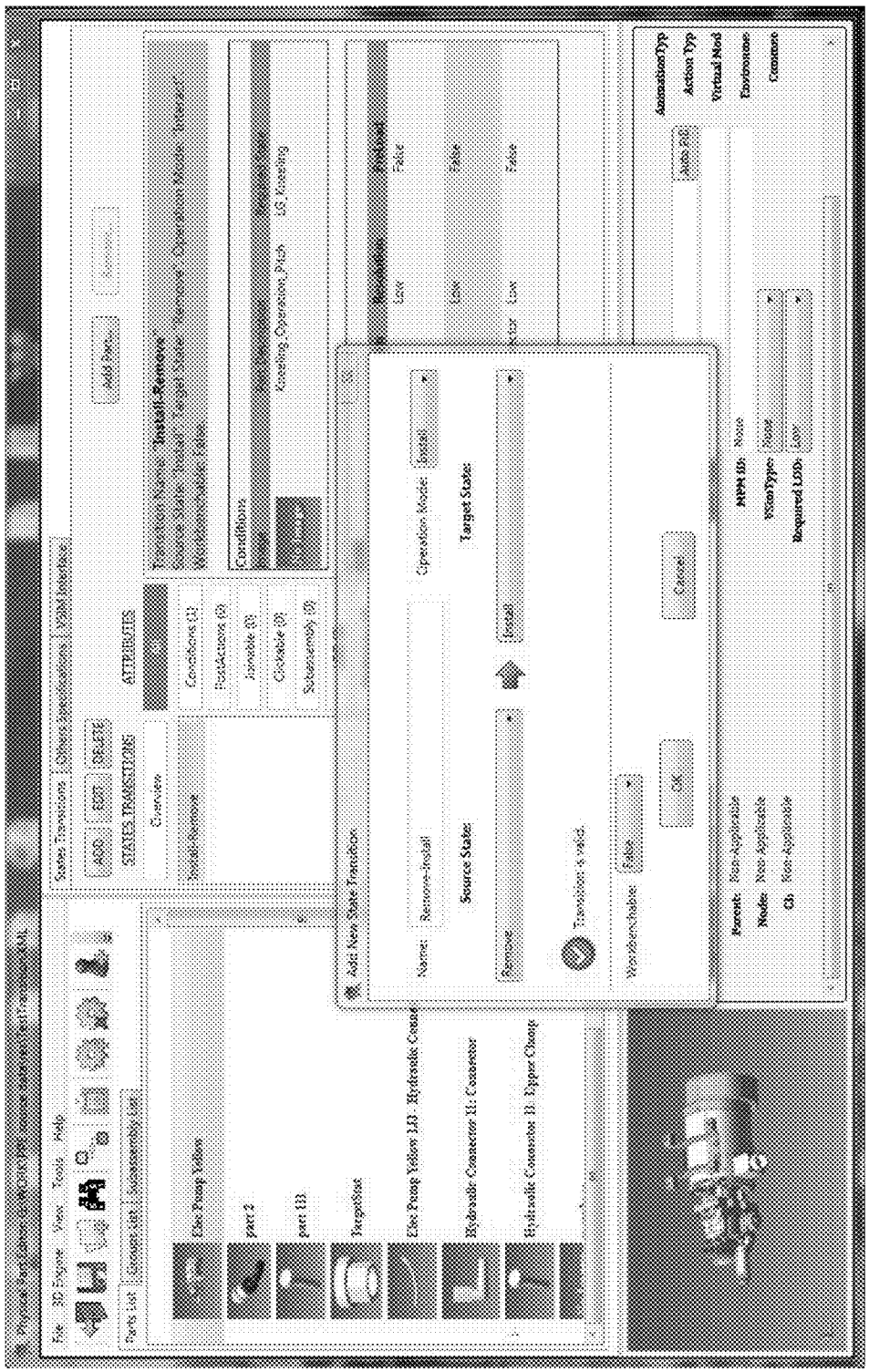
Figure 11:
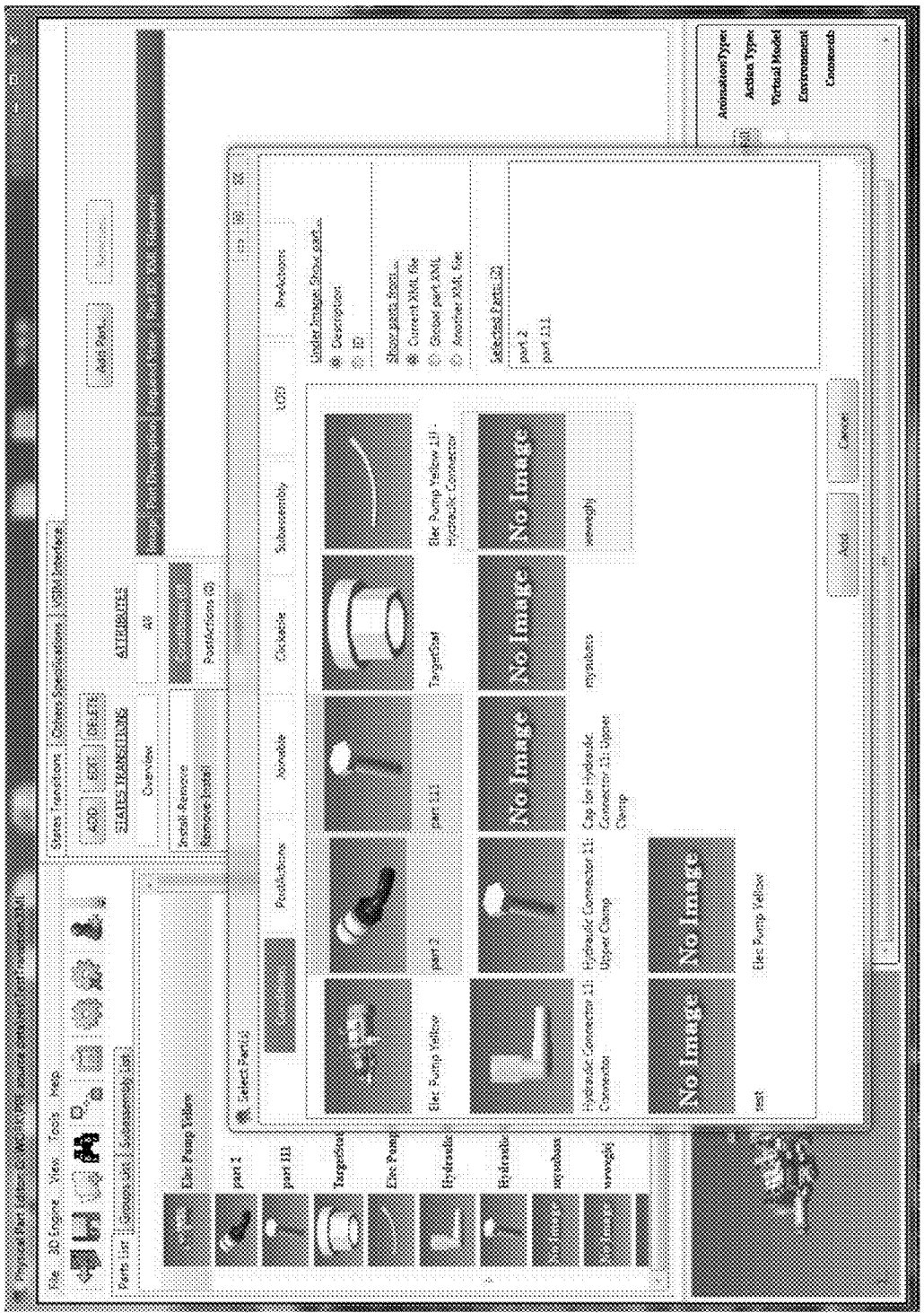
Figure 12:
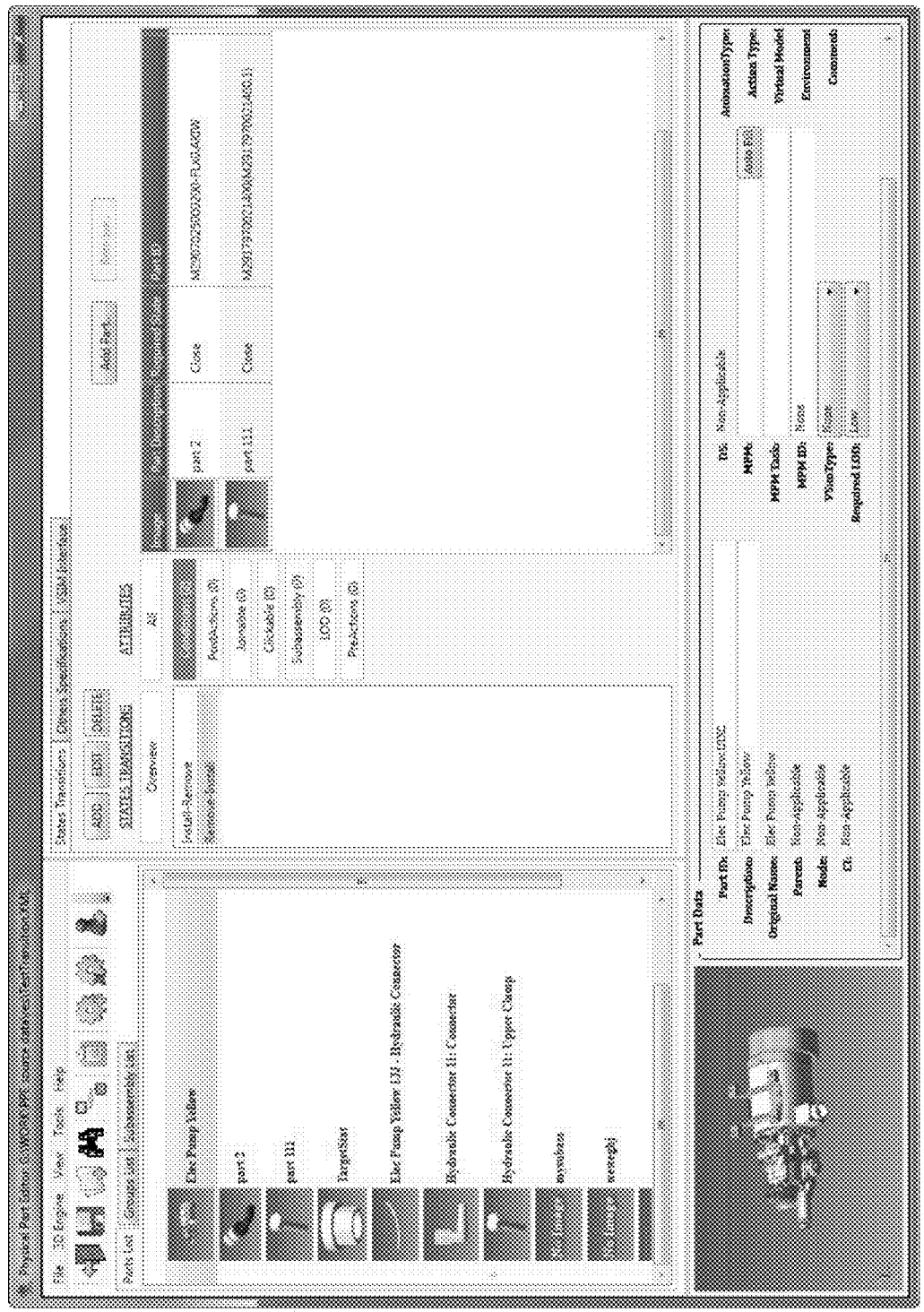
Figure 13:
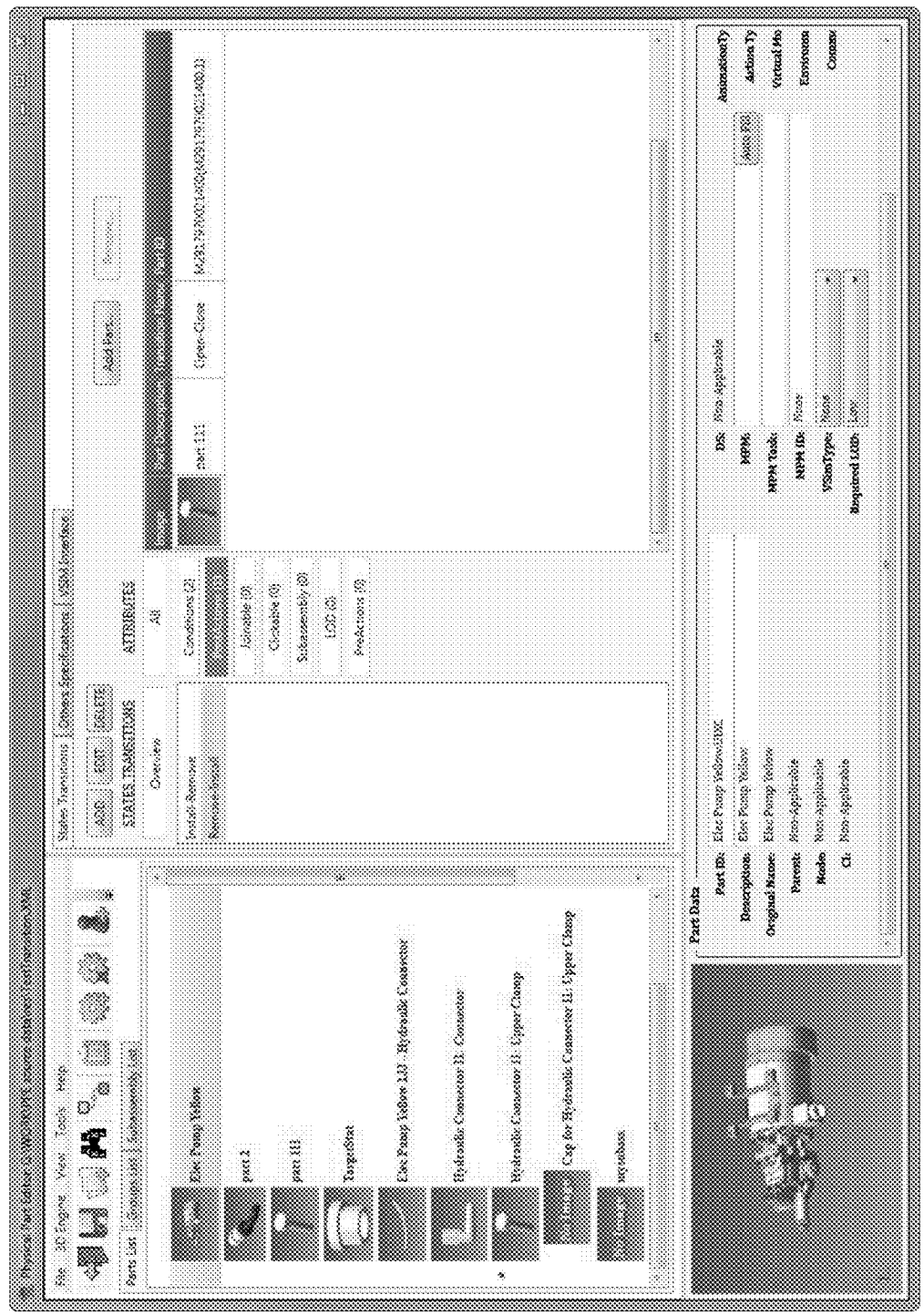
Figure 14:
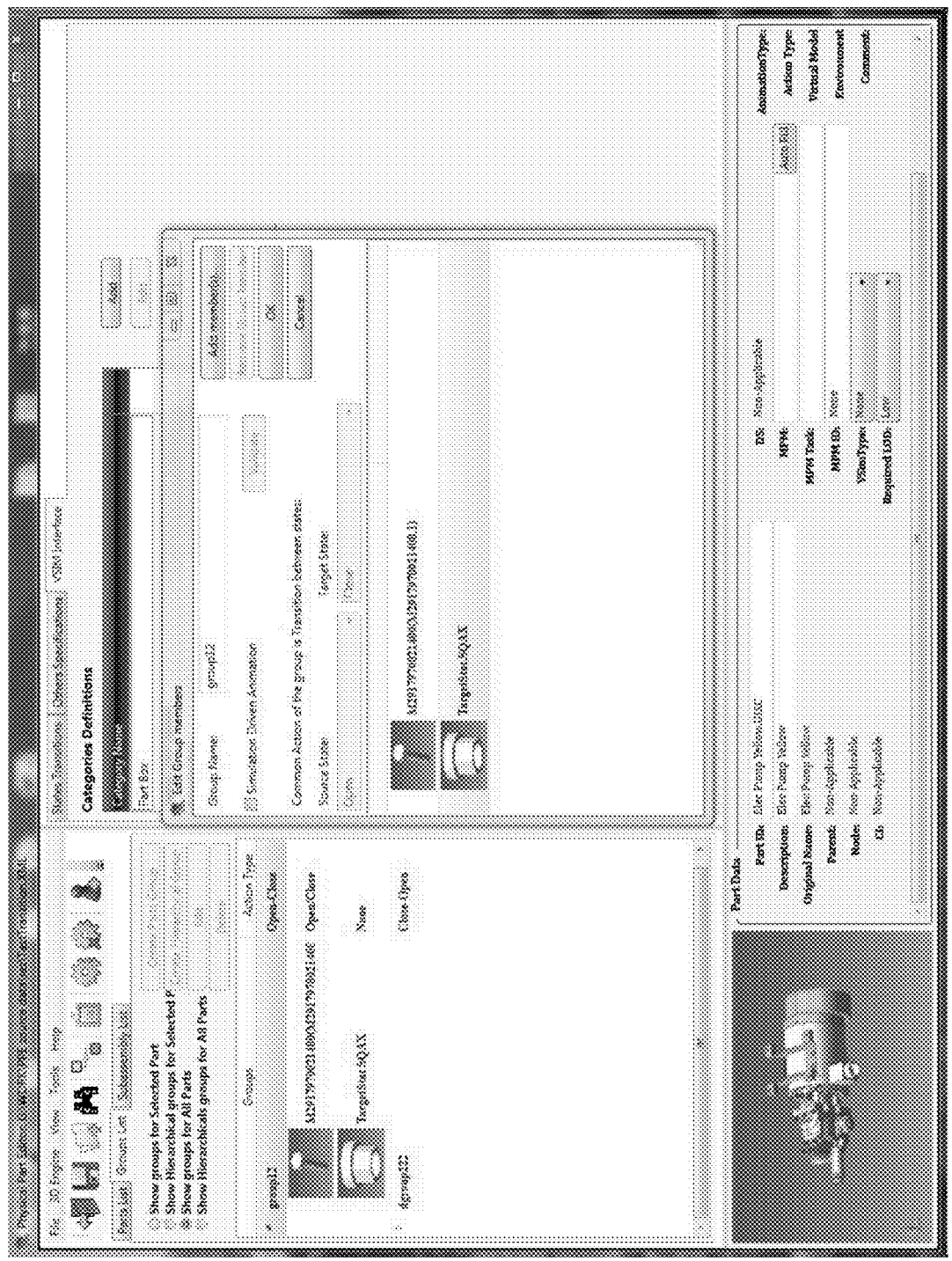
Figure 15:
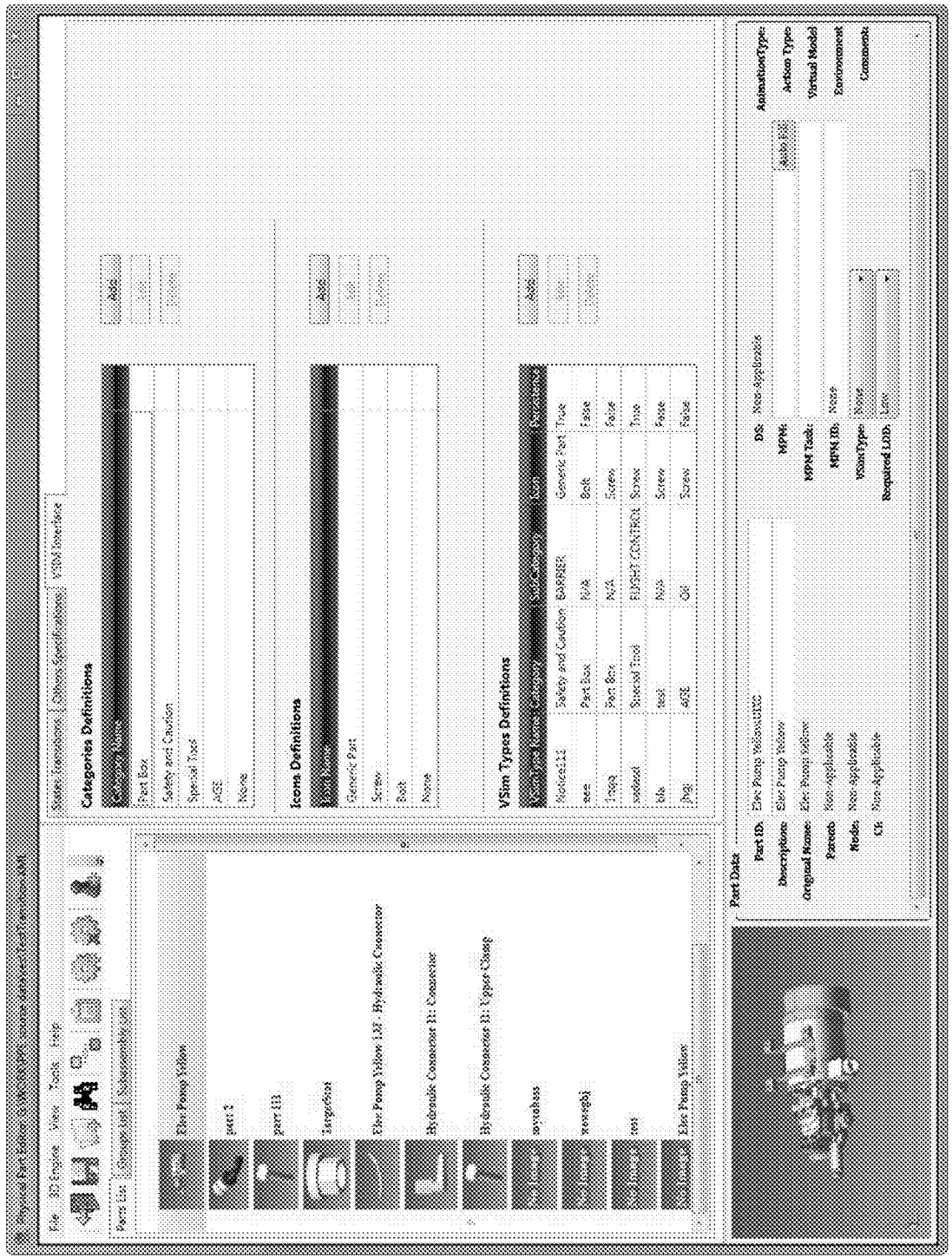

In another particular aspect, the method 200 determines a group behavior via the configuration interface 103. A group consists of a plurality of components having a same transition between a same source and a same target states. Furthermore, a group behavior consists of applying the transition to all the other components of the group when the transition is applied to a particular component of the group. Referring to FIG. 8, an exemplary group behavior 700 is illustrated. The components A, B and C form a group 701 that can undergo a transition (removal) from the same source state installed to the same target state uninstalled; and a transition (installation) from the same source state uninstalled to the same target state installed. Triggering removal of component A automatically triggers removal of components B and C. Similarly, triggering installation of component B automatically triggers installation of components A and C. Thus the target state of any components of the group can be changed by clicking another component of the group.

The maintenance simulation data generated by the modeling tool 100 are transmitted to one (or several) simulator(s) 160 via the output unit 106. The simulator 160 uses the maintenance simulation data to perform a simulation and train a user of the simulator 160. For example, a processing unit of the simulator 160 processes the maintenance simulation data and generates simulation scenarios, displays data related to the simulation scenarios on a display of the simulator 160, and allows the user to interact with the simulation scenarios via a user interface of the simulator 160. Furthermore, the simulator 160 may comprise several user modes selectable by a user of the simulator 160. For example, the simulator 160 may comprise a learning mode and a test mode.

In the learning mode, the user is guided in order to teach him a series of steps in respect to the maintenance of at least one of the components of the vehicle. In this specific mode, the user is only able to trigger the transitions of components authorized by the maintenance simulation. If the user tries to trigger an unauthorized transition of a component (conditions on other components for performing the transition are not met), the simulator 160 may prompt the user with an error message indicating that an unauthorized transition was triggered; and the simulator may further indicate the reasons why the transition is unauthorized. For instance, if the user triggers the dismantling of a sub-assembly before triggering removal of some of the parts of this sub-assembly, the simulator 160 does not perform the transition (dismantling) since conditions on the parts (removed state) are not met. For example, if a user triggers dismantling of one of the wheels (parent sub-assembly) of an vehicle without firstly removing all the nuts (child part) holding the washers of the wheels, the user is prevented by the simulator 160 from triggering the dismantling of the wheel until he triggers removal of all the respective nuts holding the washers.

In the testing mode, the simulator 160 may provide a completely or a semi-completely free environment for the user of the simulator 160, in order to test the knowledge or the skills of the user in respect to the steps and sequence of the steps for performing the maintenance of at least one of the components of a vehicle. In a completely free environment, contrarily to the learning mode, the user can choose to trigger any transitions of components, even if a transition is not unauthorized (conditions on other components for performing the transition are not met). In a semi-completely free environment, contrarily to the learning mode, the user can choose to trigger most of the transitions of components, even if a transition is unauthorized (conditions on other components for performing the transition are not met). Therefore, some of the unauthorized transitions may be performed by the simulator 160 when triggered by the user, while some of the unauthorized transitions may not be performed by the simulator when triggered by the user. Thus, the semi-completely free environment offers the option to target a certain range of desired transitions depending on the user's level of knowledge or skills that is sought to be taught or evaluated. For instance, if the user triggers the dismantling of a sub-assembly before triggering removal of some of the parts of this sub-assembly, the simulator 160 performs the transition (dismantling) even if conditions on the parts (removed state) are not met. At the end of the simulation, the simulator 160 prompts the user with the mistakes he has done and identifies the wrongful order of transitions the user has triggered. The simulator 160 may then replay a simulation sequence with the correct order of transitions.

The aforementioned user modes may have different appellations and may have various levels of limitations in respect to transitions of components which can be performed by the simulator 160, from very limited to completely free.

Although the present disclosure has been described hereinabove by way of non-restrictive, illustrative embodiments thereof, these embodiments may be modified at will within the scope of the appended claims without departing from the spirit and nature of the present disclosure.

What is claimed is:

1. A modeling computing device for generating a maintenance simulation model of a vehicle, the modeling computing device comprising:
   a communication interface for receiving data, the received data comprising:
      a list of components of the vehicle, each particular component comprising a version of the particular component and parameters defining the particular component, and a value of some of the parameters depending on the version of the particular component; and
      relationships between the components in the list, the relationships between the components defining a hierarchy of the components in the list;
   a configuration interface for configuring data, the configured data comprising:

a plurality of states of a specific component of the hierarchy of components;
transitions between the states of the specific component;
conditions for executing the transitions, each condition comprising at least one other component being in a particular state;
triggers of the transitions; and
actions triggered by the transitions of the specific component, each action comprising at least one transition of another component;
at least one memory for:
storing the list of components and the relationships between the components; and
storing the maintenance simulation model;
a display for:
displaying the hierarchy of components based on the relationships between the components; and
a processing unit for:
storing the received list of components and relationships between the components in the memory;
processing the data received via the communication interface and the data configured via the configuration interface to generate the maintenance simulation model of the vehicle, the maintenance simulation model comprising an aggregation of all the configured transitions between the components into a global state machine, the maintenance simulation model allowing a simulator to perform a simulation of a maintenance of the vehicle when processed by a processing unit of the simulator;
storing the generated maintenance simulation model of the vehicle in the memory;
transmitting via the communication interface the generated maintenance simulation model of the vehicle comprising the aggregation of all the configured transitions between the components into the global state machine to at least one simulator having a processing unit for processing the maintenance simulation model to perform the simulation of the maintenance of the vehicle; and
automatically updating the maintenance simulation model with updated parameters corresponding to an updated version of a component, the updated parameters and version being received via the communication interface.

2. The modeling computing device of claim 1, wherein the components comprise assemblies, sub-assemblies and parts of the vehicle.

3. The modeling computing device of claim 2, wherein an assembly has a relationship with at least one of a sub-assembly or a part, and a sub-assembly has a relationship with at least one part.

4. The modeling computing device of claim 1, wherein the relationship between two components further comprises a position of one of the two components with respect to at least one other component.

5. The modeling computing device of claim 1, wherein the parameters of a component comprise a name of the component and a graphical representation of the component.

6. The modeling computing device of claim 1, wherein a group behavior is configured via the configuration interface, the group consisting of a plurality of components having a same transition between a same source and a same target states, the group behavior consisting of applying the transition when applied to a particular component of the group to all the other components of the group.

7. The modeling computing device of claim 1, wherein the configuration interface comprises a user interface for configuring the states, transitions, conditions, triggers and actions.

8. A method for generating a maintenance simulation model of a vehicle, the method comprising:
receiving data via a communication interface of a modeling computing device, the received data comprising:
a list of components of the vehicle, each particular component comprising a version of the particular component and parameters defining the particular component, a value of some of the parameters depending on the version of the particular component; and
relationships between the components in the list, the relationships between the components defining a hierarchy of the components in the list;
displaying on a display of the modeling computing device the hierarchy of components based on the relationships between the components;
configuring data via a configuration interface of the modeling computing device, the configured data comprising:
a plurality of states of a specific component of the hierarchy of components;
transitions between the states of the specific component;
conditions for executing the transitions, each condition comprising at least one other component being in a particular state;
triggers of the transitions; and
actions triggered by the transitions of the specific component, each action comprising at least one transition of another component;
processing by a processing unit of the modeling computing device the data received via the communication interface of the modeling computing device and the data configured via the configuration interface of the modeling computing device to generate the maintenance simulation model of the vehicle, the maintenance simulation model of the vehicle comprising an aggregation of all the configured transitions between the components into a global state machine, the maintenance simulation model of the vehicle allowing a simulator to perform a simulation of a maintenance of the vehicle when processed by a processing unit of the simulator;
transmitting by the processing unit of the modeling computing device via the communication interface of the modeling computing device the generated maintenance simulation model of the vehicle comprising the aggregation of all the configured transitions between the components into the global state machine to at least one simulator having a processing unit for processing the maintenance simulation model of the vehicle to perform the simulation of the maintenance of the vehicle; and
receiving via the communication interface of the modeling computing device updated parameters corresponding to an updated version of a component, and automatically updating by the processing unit of the modeling computing device the maintenance simulation model of the vehicle with the updated parameters.

9. The method of claim 8, wherein the components comprise assemblies, sub-assemblies and parts of the vehicle.

10. The method of claim 9, wherein an assembly has a relationship with at least one of a sub-assembly or a part, and a sub-assembly has a relationship with at least one part.

11. The method of claim 8, wherein the relationship between two components further comprises a position of one of the two components with respect to at least one other component.

12. The method of claim 8, wherein the parameters of a component comprise a name of the component and a graphical representation of the component.

13. The method of claim 8, further comprising configuring via the configuration interface of the modeling computing device a group behavior, the group consisting of a plurality of components having a same transition between a same source and a same target states, the group behavior consisting of applying the transition when applied to a particular component of the group to all the other components of the group.

14. The method of claim 8, wherein the vehicle is one of the following: an aircraft or a tank.

15. A non-transitory computer program product comprising instructions deliverable via an electronically-readable media such as storage media and communication links, the instructions when executed by a processing unit of a modeling computing device providing for generating a maintenance simulation model of a vehicle by:

receiving data via a communication interface of the modeling computing device, the received data comprising:
  a list of components of the vehicle, each particular component comprising a version of the particular component and parameters defining the particular component, a value of some of the parameters depending on the version of the particular component; and
  relationships between the components in the list, the relationships between the components defining a hierarchy of the components in the list;

displaying on a display of the modeling computing device the hierarchy of components based on the relationships between the components;

configuring data via a configuration interface of the modeling computing device, the configured data comprising:
  a plurality of states of a specific component of the hierarchy of components;
  transitions between the states of the specific component;
  conditions for executing the transitions, each condition comprising at least one other component being in a particular state;
  triggers of the transitions; and
  actions triggered by the transitions of the specific component, each action comprising at least one transition of another component;

processing by the processing unit of the modeling computing device the data received via the communication interface of the modeling computing device and the data configured via the configuration interface of the modeling computing device to generate the maintenance simulation model of the vehicle, the maintenance simulation model of the vehicle comprising an aggregation of all the configured transitions between the components into a global state machine, the maintenance simulation model allowing a simulator to perform a simulation of a maintenance of the vehicle when processed by a processing unit of the simulator; and transmitting by the processing unit of the modeling computing device via the communication interface of the modeling computing device the generated maintenance simulation model of the vehicle comprising the aggregation of all the configured transitions between the components into the global state machine to at least one simulator having a processing unit for processing the maintenance simulation model to perform the simulation of the maintenance of the vehicle.

* * * * *